(12) United States Patent
Guo et al.

(10) Patent No.: US 9,583,418 B2
(45) Date of Patent: Feb. 28, 2017

(54) CHIP EMBEDDED PACKAGE METHOD AND STRUCTURE

(71) Applicant: NATIONAL CENTER FOR ADVANCED PACKAGING CO., LTD., Wuxi, Jiangsu Province (CN)

(72) Inventors: Xueping Guo, Beijing (CN); Zhongyao Yu, Beijing (CN)

(73) Assignee: National Center For Advanced Packaging Co., Ltd., Wuxi, Jiangsu Province (CN)

( * ) Notice: Subject to any disclaimer, the term of this patent is extended or adjusted under 35 U.S.C. 154(b) by 0 days.

(21) Appl. No.: 14/311,811

(22) Filed: Jun. 23, 2014

(65) Prior Publication Data
US 2015/0091155 A1 Apr. 2, 2015

(30) Foreign Application Priority Data

Sep. 29, 2013 (CN) .......................... 2013 1 0457111

(51) Int. Cl.
*H01L 23/48* (2006.01)
*H01L 23/367* (2006.01)
(Continued)

(52) U.S. Cl.
CPC .......... *H01L 23/481* (2013.01); *H01L 21/486* (2013.01); *H01L 23/3675* (2013.01); *H01L 23/5384* (2013.01); *H01L 23/5389* (2013.01); *H01L 23/552* (2013.01); *H01L 24/19* (2013.01); *H01L 24/20* (2013.01); *H01L 23/49816* (2013.01); *H01L 24/16* (2013.01); *H01L 24/32* (2013.01); *H01L 24/73* (2013.01); *H01L 24/92* (2013.01); *H01L 25/105* (2013.01); *H01L 2224/04105* (2013.01); *H01L 2224/12105* (2013.01); *H01L 2224/16227* (2013.01); *H01L 2224/16235* (2013.01); *H01L 2224/32225* (2013.01); *H01L 2224/32245* (2013.01); *H01L 2224/73204* (2013.01); *H01L 2224/73267* (2013.01); *H01L 2224/92144* (2013.01); *H01L 2225/1035* (2013.01); *H01L 2225/1058* (2013.01); *H01L 2225/1094* (2013.01);
(Continued)

(58) Field of Classification Search
CPC ........................ H01L 25/0652; H01L 25/0657
See application file for complete search history.

(56) References Cited

U.S. PATENT DOCUMENTS

| 6,423,570 B1 * | 7/2002 | Ma | ........................ | H01L 21/561 257/612 |
|---|---|---|---|---|
| 2012/0056312 A1 * | 3/2012 | Pagaila | ................. | H01L 21/561 257/684 |

* cited by examiner

*Primary Examiner* — Yu-Hsi D Sun
(74) *Attorney, Agent, or Firm* — Jingming (James) Cai; SAC Attorneys LLP

(57) ABSTRACT

A chip embedded package method is provided by an embodiment of the present invention. The method comprises: etching metallic sinks on the thicker metal layer of each organic substrate; part of metallic sinks is used for packaging at least one chip, and other metallic sinks are used for via-holes; mounting the at least one chip into a metallic sink of each organic substrate via adhesive; flipping one organic substrate on another to form a combination; drilling blind-holes on both sides of the combination of the two organic substrates to pass through the adhesive; drilling via-holes to get through the combination of the two organic substrates, wherein the via-holes locates beyond the metallic sinks with chips; filling the blind-holes and via-holes with conductive medium through an electroplating process.

7 Claims, 6 Drawing Sheets

(51) Int. Cl.
- *H01L 23/538* (2006.01)
- *H01L 23/00* (2006.01)
- *H01L 21/48* (2006.01)
- *H01L 23/552* (2006.01)
- H01L 23/498 (2006.01)
- H01L 25/10 (2006.01)

(52) U.S. Cl.
CPC ............... *H01L 2924/12042* (2013.01); *H01L 2924/15311* (2013.01)

CHIP EMBEDDED PACKAGE METHOD AND STRUCTURE

CROSS-REFERENCE TO RELATED APPLICATION

This application claims priority from CN Patent Application Serial No. 201310457111.0, filed on Sep. 29 2013, the entire contents of which are incorporated herein by reference for all purposes.

FIELD OF THE INVENTION

The present invention is related to semiconductor package technology, especially related to a chip embedded package method and structure.

BACKGROUND OF THE INVENTION

With continuous development of information technology, mobile phones and other various electronic products become thinner and lighter. Mobile phones and computers have more and more functions while the size of which become smaller and smaller. Therefore, the requirement of the integration level of chips and devices becomes higher and higher. Along with the development of large-scale integration circuit, the integration level has reached an unprecedented level as the line width is approaching 22 nm. Meantime, more improvement of related technology and devices is also required. Since further reduction of line width becomes more and more difficult, the development of related technology process and devices therefore slows down.

In this case, 3D high density packaging technology has attracted widely attention, by which, no longer one chip but several chips can be packaged in one device. In addition, the chips are stacked into a 3D high-density assembled microchip rather than being arranged in the same layer. Hence, the 3D chip stacking greatly reduces the size of the device. Furthermore, the chip stacking process is also constantly developed. From FLIP CHIP technology to TSV (Through Silicon Via) through-hole interconnection technology, electronic devices become smaller and smaller. Package process is improved by technologies from the traditional bonding, chipping and plastic package to current essential processes such as RDL (Redistribution Layer), Flip Chip, wafer bonding, TSV and so on. Consequently, package structures with smaller sizes and higher chip density emerges continually.

By using the prior chip embedding technology, mass-production cannot be achieved efficiently due to the unreliability of heat dissipation. Especially for high-power devices, the application of chip embedded package is restricted by the heat dissipation management.

SUMMARY OF THE INVENTION

Embodiments of the present invention disclose a chip embedded package method and structure, to solve the unreliability of heat dissipation.

The chip embedded package method provided by an embodiment of the present invention is applied on at least two organic substrates, each organic substrate includes: two metal layers and a core layer sandwiched between the two metal layers, one metal layer is thicker than the other one; and the method includes:

etching metallic sinks on the thicker metal layer of each organic substrate; part of metallic sinks are used for packaging at least one chip, and other metallic sinks are used for via-holes;

mounting the at least one chip into a metallic sink of each organic substrate via adhesive;

flipping one organic substrate on another to form a combination;

drilling blind-holes on both sides of the combination of the two organic substrates to pass through the adhesive;

drilling via-holes to get through the combination of the two organic substrates, wherein the via-holes locates beyond the metallic sinks with chips;

filling the blind-holes and via-holes with conductive medium through an electroplating process.

A chip embedded package structure provided by an embodiment of the present invention includes:

a combination of two organic substrates, wherein, one organic substrate is flipped on the other and each organic substrate includes:

a core layer sandwiched between two metal layers, one metal layer thicker than the other one;

metallic sinks etched on the thicker metal layer; part of metallic sinks used for packaging at least one chip, and other metallic sinks used for via-holes;

the at least one chip mounted into a metallic sink via adhesive;

blind-holes on both sides of the combination of the two organic substrates and passing through the adhesive;

via-holes, getting through the combination of the two organic substrates and locating beyond the metallic sinks with chips;

wherein, the blind-holes and via-holes are filled with conductive medium.

Compared with the prior art, the advantages of the present invention are as follows.

(1) the heat dissipation problem of high power devices with chip embedded is solved. The design of blind-holes and via-holes filled with conductive medium in the present invention provides good performance of heat dissipation.

(2) The package structure provided includes two layers of embedded chips, which satisfies the miniaturization and integration requirement in system-level integrated package.

BRIEF DESCRIPTION OF THE DRAWINGS

To give a further description of the embodiments in the present invention or the prior art, the appended drawings used to describe the embodiments and the prior art will be introduced as follows. Obviously, the appended drawings described here are only used to explain some embodiments of the present invention. Those skilled in the art can understand that other drawings may be obtained according to these appended drawings without creative work.

DETAILED DESCRIPTION OF THE INVENTION

Figure 1:
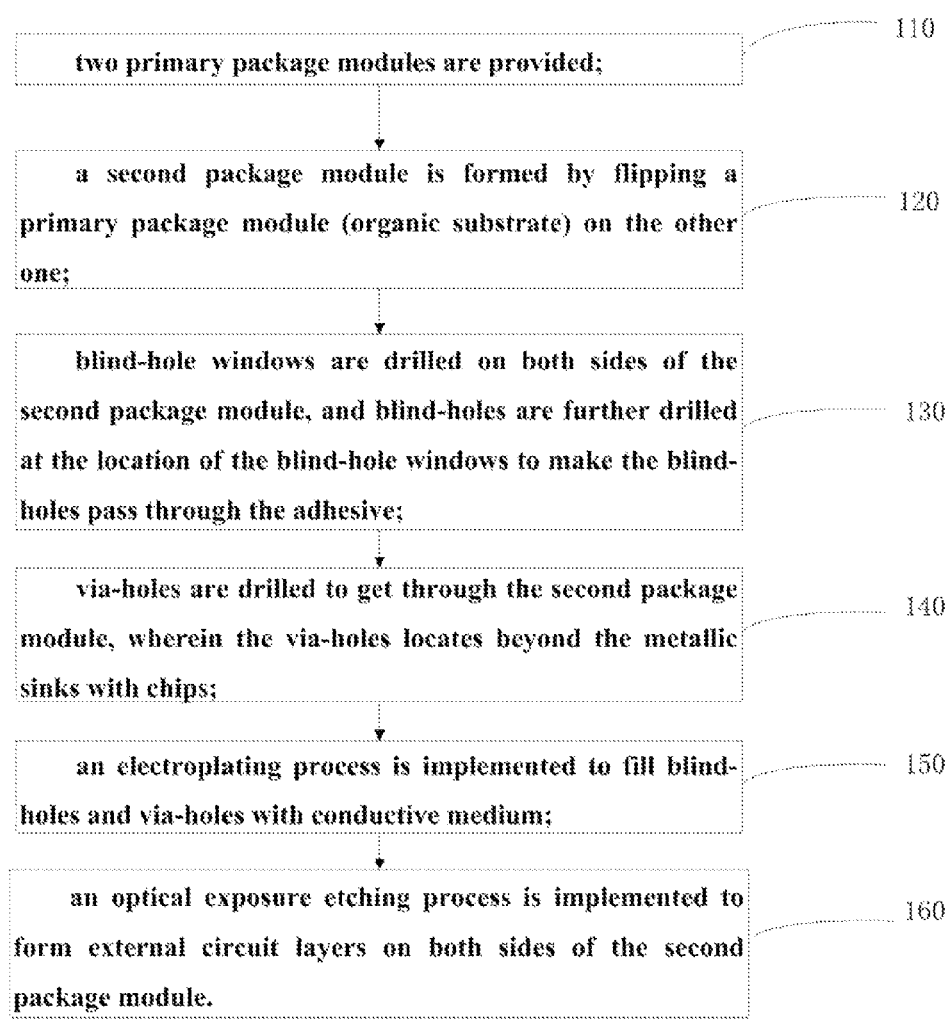
FIG. 1 illustrates the flow diagram of a chip embedded package method in an embodiment of the present invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

The order of the steps in the present embodiment is exemplary and is not intended to be a limitation on the embodiments of the present invention. It is contemplated that the present invention includes the process being practiced in other orders and/or with intermediary steps and/or processes.

The embodiments of the present invention are described more fully hereinafter with reference to the drawings, which show, by way of illustration, specific exemplary embodiments that the invention may be practiced. In some embodiments of the present invention, the cross-sectional views are exemplary and not enlarged in proportion, which is not intended to be a limitation on the embodiments of the present invention. Besides, 3D sizes such as length, width and depth should be considered in a practical implementation.

Further, those terms, such as "the first surface", "the second surface", "the primary side", "the side" and "the surface" indicates orientations and positions shown in the drawings. Therefore, when it says thinning or thickening "sides" or "surfaces" of particular parts or modules in the embodiments, it should be considered to include the extension of "sides" or "surfaces". The illustration in the embodiments do not to restrict the present invention to a particular structure and operation, and it should not be used to limit the protection scope of the present invention.

FIG. 1 illustrates the flow diagram of a chip embedded package method in an embodiment of the present invention. As shown in FIG. 1, the chip embedded package method provided includes following steps.

Step 110, two primary package modules are provided. As shown in FIG. 2a~2d, the primary package modules are actually organic substrates respectively. In each primary package module, a chip 102 is packaged in a metallic sink 103 on the organic substrate 101. To simplify the description, a side of the primary package module with a thicker metal layer is indicated as a first main surface S1 and its opposition is indicated as a second main surface S2. An active side M of the chip 102 is in the same direction with the surface S2, and adhesive 102a is set under the surface M to adhesive the chip to the bottom of the metallic sink.

FIG. 2a~2d illustrate a process of constructing an organic substrate in an embodiment of the present invention. As shown in FIG. 2a~2d, the process of constructing an organic substrate includes following steps.

Figure 2A:
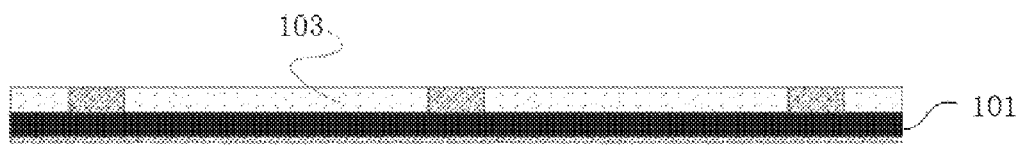
FIG. 2a~2e illustrate a process of constructing a combination of two organic substrates in an embodiment of the present invention.
Figure 2B:

Step 1: as shown in FIG. 2a and FIG. 2b, an organic substrate 101 with two metal layers and a core layer sandwiched between the two metal layers is provided. At least one metallic sinks 103 are etched on the side of the organic substrate 101 with thicker metal layer. Some of the metallic sinks, shown as 103, are used to package at least one chip; others are used for via-holes. The size of the metallic sink 103, such as length, width and height, should fit a chip 102 so that the chip 102 can be packaged in the metallic sink 103. Those skilled in the art can understand that one or multiple chips 102 may be packaged in a metallic sink 103.

The organic substrate 101 includes a core layer and two metal layers, one of which is thicker than the other and the thicker one is used for packaging the chip. The core layer is sandwiched between the two metal layers. In an embodiment of the present invention, the metal layers are made of copper material. An optical exposure is implemented on the thicker metal layer to produce the image of the chip 102 and via-holes, and then the copper material positioned in the fields corresponding to the image is etched off through an etching process to form metallic sinks. During the optical exposure process, exposure material should be pre-processed and the exposure image should be compensated according to process conditions. It should be noticed that this embodiment is based on the situation that the thickness of the metal layer is sufficient to be larger than the sum height of the chip 102 and the adhesive (used to mount the chip 102), so that the metallic sinks 103 can be directly formed on the organic substrate 101.

Those skilled in the art can understand that, as the manufacturing technology of organic substrates has been well developed and the material cost is low. The requirement of reliability can be consequently satisfied when the organic substrate is applied.

To simply description, only one metallic sink 103 will be described, however, those skilled in the art can understand there may be more than one metallic sinks 103, such as two metallic sinks 103 as shown in figures.

Step 2: as shown in FIG. 2b, the chip 102 is attached into the metallic sink 103, herein, the active side M is touched with the bottom of the metallic sink 103 via adhesive 102a.

Figure 3:
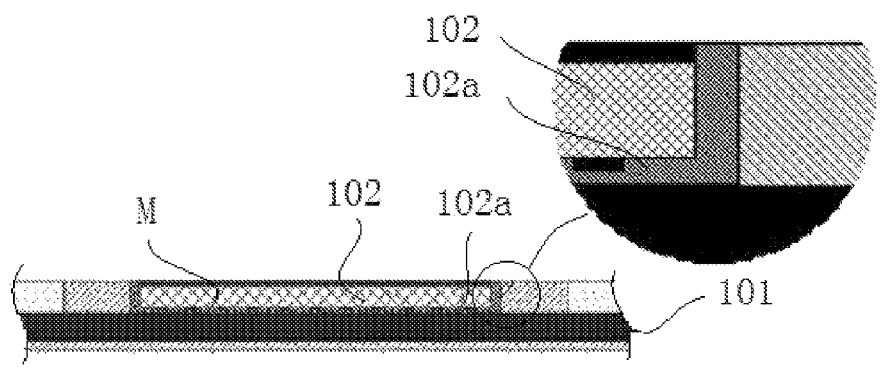
FIG. 3 illustrates partial enlarged view of FIG. 2b.

FIG. 3 illustrates partial enlarged view of FIG. 2b. As shown in FIG. 3, the adhesive 102a is required to cover the bottom and edge of the chip 102.

Moreover, in order to proceed with the process on the organic substrate, the back of the chip 102 should be processed through a metallization process, in which materials such as gold, copper or nickel may be applied; or through a non-metallization process, such as spinning coating adhesive on the back of the chip 102. The process will be specifically described in Step 3.

Figure 2C:
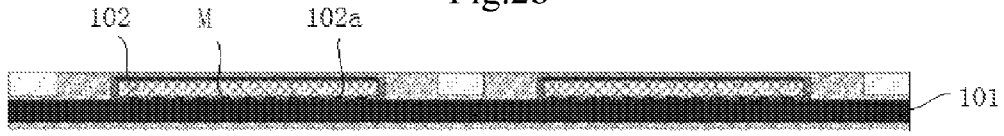

Step 3: as illustrated in FIG. 2c, the chip 102 is packaged through a metallization process on the opening direction of the metallic sink 103. In an embodiment of the present invention, the metallization process includes following two steps. First, a metallic layer is formed on the opening direction of the metallic sink 103 through an electroless plating process, the thickness of which is normally controlled below 1 μm. Then an electroplating process is implemented on the same side to make the thickness of the metallic layer larger than 50 μm.

Those skilled in the art can understand that, the metallic layer on the opening direction of the metallic sink 103 can be considered as shielding layer to reduce the electromagnetic interference between packaged chips and improve the electromagnetic compatibility performance.

Figure 2D:
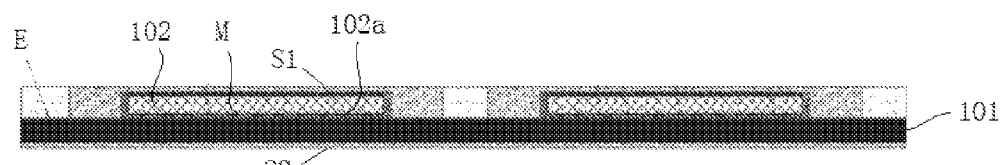

Step 4: as shown in FIG. 2d, the metallic layer in the fields E which corresponds to the via-holes is etched. Actually, the fields E are metallic sinks used for via-holes. Then a primary package module is constructed. By comparing FIGS. 2c and 2d, it can be known that only the metallic layer in fields E is etched off.

Those skilled in art can understand the primary package module is organic substrate essentially. The concepts of "primary package module" and "second package module" are only used to simplify the description.

Figure 2E:
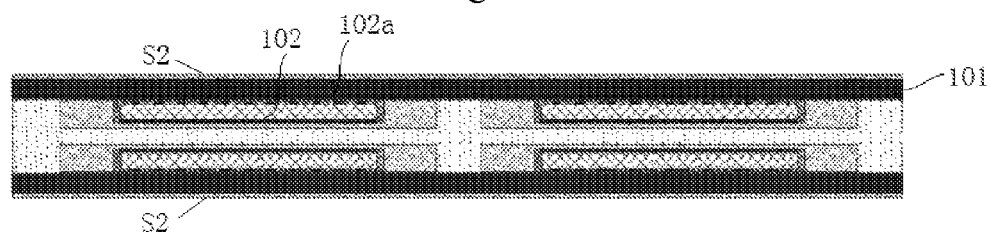

Step 120: as shown in FIG. 2e, a second package module 100 is formed by flipping a primary package module (organic substrate) on the other one. In the second package module, the chip 102, packaged in the metallic sinks 103 are between the two core layers of the two primary package modules respectively.

In an embodiment of the present invention, there is a prepreg or ABF (Ajinomoto Bond Film) between the two primary package modules (organic substrates). When a prepreg (one of main materials used in multilayer board manufacturing and made of resin and reinforcement material) is used, windows matching with the chips are mechanically opened on both sides of the prepreg. Then the two organic substrates are compressed by sandwiching the prepreg between the two organic substrates through a thermal compressing process. If an ABF is used, the ABF material should be thick enough to be directly performed by a vacuum compressing process.

In the embodiments above, the second package module 100 (the combination of two organic substrates) is constructed after steps 110 and 120.

FIG. 4a~4h illustrate a process of constructing a combination of two organic substrates in another embodiment of the present invention. As shown in FIG. 4a~4h, the second package module (the combination of two organic substrates) 100 may be constructed through following steps.

Figure 4A:
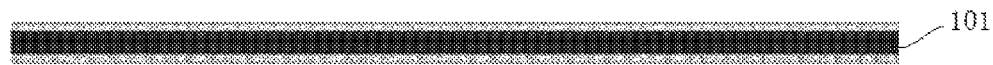
FIG. 4a~4h illustrate a process of constructing a combination of two organic substrates in another embodiment of the present invention.
Figure 4B:
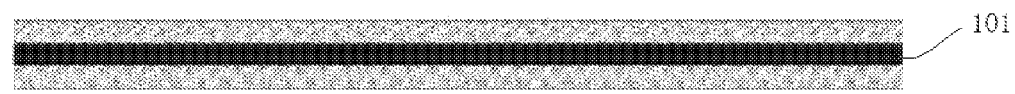

Step 1: as shown in FIG. 4a, an organic substrate 101 is provided, the thicker metal layer of which is still not thick enough to be etched to form metallic sinks 103. In an embodiment of the present invention, the organic substrate 101 may be a core layer with copper coated on both sides or obtained by compressing copper foils onto both sides of a prepreg. In this case, as shown in FIG. 4b, firstly the organic substrate 101 is required to be electroplated to thicken the metal layers, and the metal layer after electroplated should have a uniform surface and be thicker than the sum height of the chip 102 and the adhesive 102a. In an embodiment, the electroplating process is implemented on both sides of the organic substrate 101. The thickness difference between the metal layer and the sum height of the chip and the adhesive is controlled within 20 μm. As shown in FIG. 4b, compared with FIG. 4a, the metal layers on both sides of the organic substrate 101 obviously becomes thicker after the electroplating process.

Figure 4C:

Step 2: as shown in FIG. 4c, metallic sinks 103 are etched on both sides of the organic substrate 101. The sizes of the metallic sinks 103, such as length, width and height, should fit chips 102 so that the chips 102 can be packaged in the metallic sinks 103.

Figure 4D:
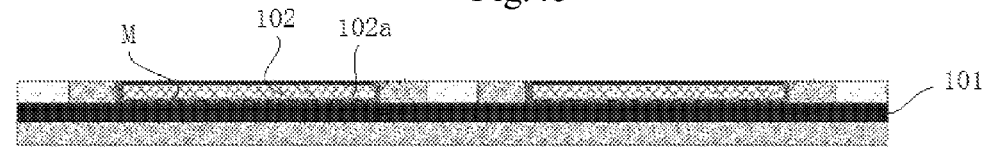

Step 3: as shown in FIG. 4d, the chips 102 are mounted into the metallic sinks 103, herein, the active side M is touched with the bottom of the metallic sinks 103 via adhesive 102a. The adhesive is required to cover the bottom and edge of the chips 102.

Figure 4E:
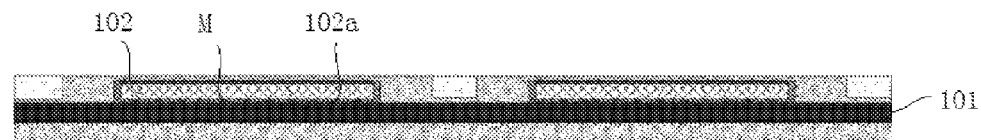

Step 4: as shown in FIG. 4e, the chips 102 are plated through a metallization process on the opening direction of the metallic sinks 103 to form a metallic layer.

Figure 4F:
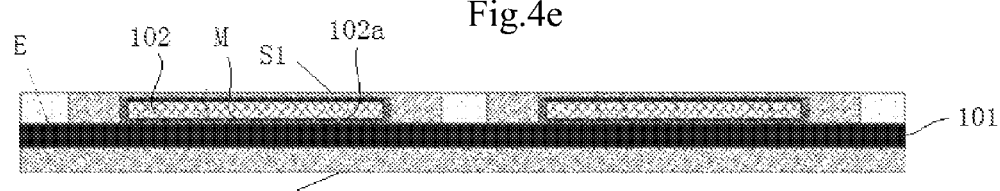

Step 5: as shown in FIG. 4f, the metallic layer in the fields E which correspond to the via-holes is etched off. The fields E are metallic sinks used for the via-holes. Then a primary package module is constructed, the bottom metal layer of which is thicker than the top metal layer. To facilitate the following description, the top surface of a primary package module is represented as 51 and the bottom surface is represented as S2. Those skilled in the art can understand that, the limitations "S1" and "S2" are only used to facilitate the description, which cannot be used to limit the protection scope of the present invention.

Figure 4G:
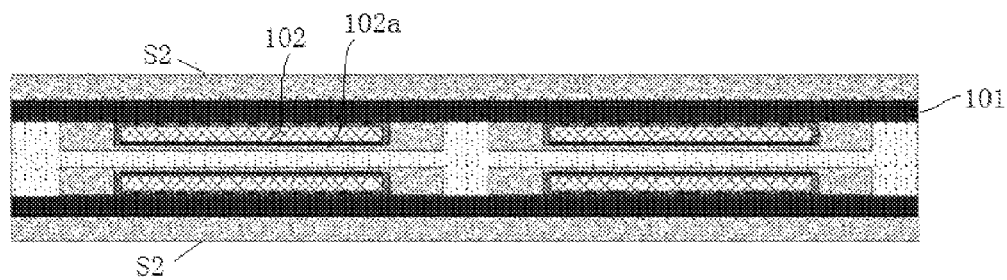

Step 6: as shown in FIG. 4g, a second package module 100 is formed by flipping one primary package module on the other one. Those skilled in the art can understand the second package module is a combination of two organic substrates essentially.

Figure 4H:
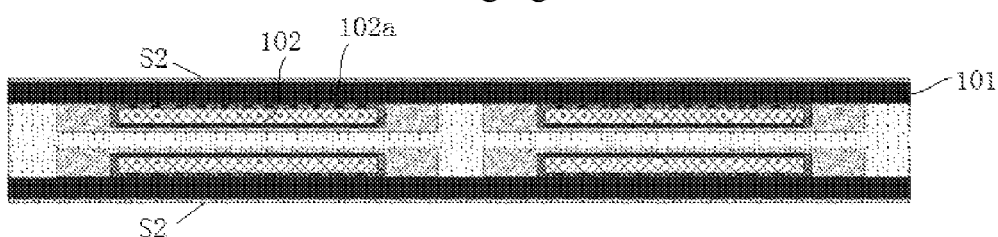

Step 7: as shown in FIG. 4h, the two metal layers on the two surfaces S2 is thinned.

Specifically, the two metal layers on the two surfaces S2 are etched off to 2.5 μm~3.5 μm, during which the thickness difference of the etching surface should be controlled so that following laser drilling process can be well implemented.

FIG. 5a~5d illustrate a constructing process of blind-holes and via-holes in an embodiment of the present invention.

Figure 5A:
FIG. 5a~5d illustrate a process of constructing blind-holes and via-holes in an embodiment of the present invention.
Figure 5B:
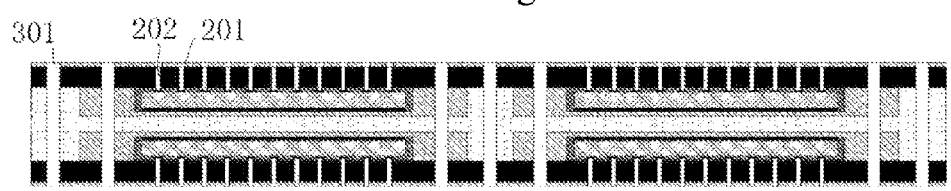

Step 130: as shown in FIG. 5a and FIG. 5b, blind-hole windows 201 are drilled on both sides of the second package module 100 (combination of the two organic substrates 101), and blind-holes 202 are further drilled at the location of the blind-hole windows 201 to make the blind-holes pass through the adhesive 102a. Specifically, the blind-hole windows 201 and/or the blind-holes 202 may be drilled precisely through a laser drilling process, to ensure the uniformity of holes. The diameter of the blind-holes 202 is required smaller than the size of the adhesive 102a, and it should ensure that the blind-holes 202 pass through the adhesive 102a. Step 140: as shown in FIG. 5b, via-holes 301 are drilled to get through the second package module 100, wherein the via-holes 301 locates beyond the metallic sinks 103 with chips. Specifically, the via-holes 301 are mechanically drilled for both electronic interconnection and heat dissipation. The via-holes 301 for electronic interconnection should be drilled in the metallic sinks 103 without chips. The via-holes 301 for heat dissipation should be drilled to be connected with the material layer used to package the chip 102, so that a better heat dissipation effect can be achieved.

Figure 5C:
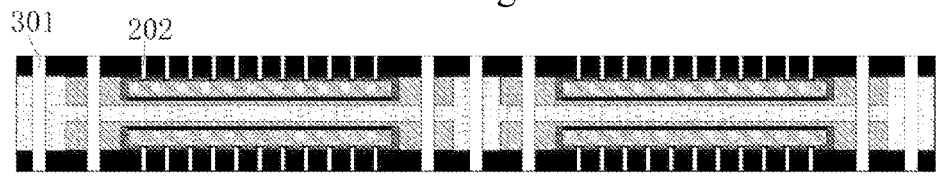
Figure 5D:
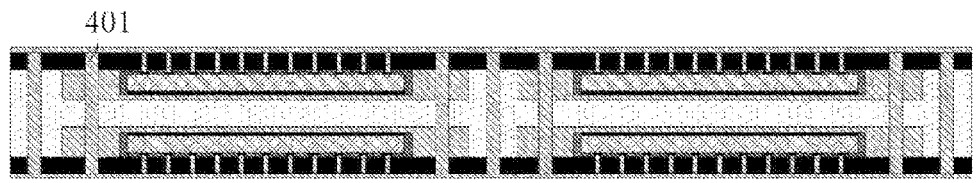

Step 150: as shown in FIG. 5d, an electroplating process is implemented to fill blind-holes 202 and via-holes 301 with conductive medium. In an embodiment of the present invention, before the electroplating process, an electroless plating process may be implemented to form a seed layer in the blind-holes 202, via-holes 301 and on both sides of the second package module 100.

In an embodiment of the present invention, the Step 150 may include following two steps.

In the first step, both the top and bottom metal layers of the second package module 100 are etched off, as shown in FIG. 5c, then an electroless plating process is implemented to form seed layers on both sides respectively. The thickness difference of the seed layer should be controlled so that following electroplating process can be well implemented.

In the second step, as shown in FIG. 5d, conductive medium 401 is filled in the blind-holes 202 and via-holes 301 through an electroplating process of PTH (plated through hole). Meantime, both sides of the second package module are also plated with the conductive medium 401. To facilitate the description, the conductive medium 401 is indicated as a first conductive medium 401. Those skilled in the art can understand that, the limitation "first conductive medium" is only used to distinguish other conductive medium described as follows, which cannot be used to limit the protection scope of the present invention.

Figure 6:
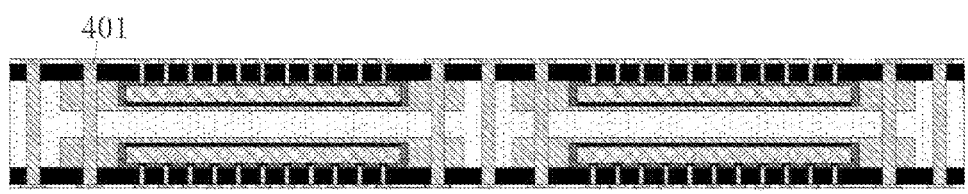
FIG. 6 illustrates a chip embedded package structure in an embodiment of the present invention.

FIG. 6 illustrates a chip embedded package structure in an embodiment of the present invention. Step 160: as shown in FIG. 6, an optical exposure etching process is implemented to form external circuit layers on both sides of the second package module. To simplify the description, the external circuit layer is indicated as a first external circuit layer. The first external circuit layer is used to further package other chips or mount solder balls.

Figure 7:
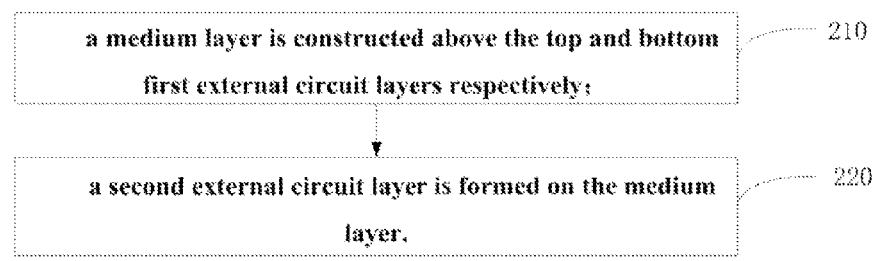
FIG. 7 illustrates the flow diagram of a chip embedded package method in an embodiment of the present invention.

FIG. 7 illustrates the flow diagram of a chip embedded package method in an embodiment of the present invention. As shown in FIG. 7, besides the steps shown in FIG. 1, the chip embedded package method further include following steps.

Figure 8A:
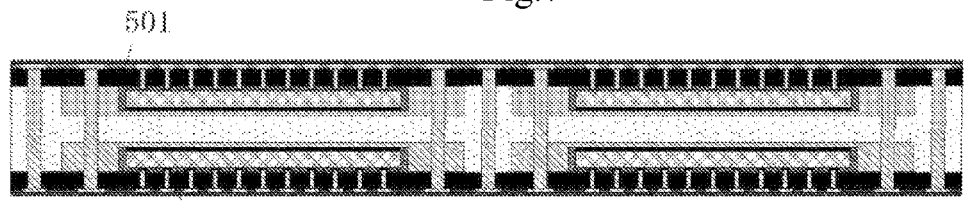
FIG. 8a~8b illustrate a process of constructing second external circuit layers in an embodiment of the present invention.

Step 210: as shown in FIG. 8a, a medium layer 500 is constructed above the top and bottom first external circuit layers respectively. Specifically, a prepreg or ABF (Ajinomoto Bond Film) may be used as the medium material of the medium layer 500.

Figure 8B:
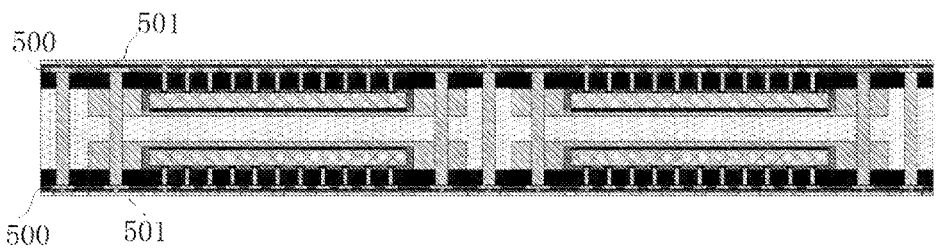

Step 220: as shown in FIG. 8b, a second external circuit layer 501 is formed on the medium layer 500. Specifically, blind-holes are firstly drilled to pass through the medium layer 500 through a laser drilling process. Then the blind-holes are filled with second conductive medium through an electroplating process to be connected with the first conductive medium 401. Meantime, both sides of the second package module are also plated with the second conductive medium. Thus the second external circuit layer 501, which is used to further package other chips and mount solder balls, can be formed on the medium layer 500.

Those skilled in the art can understand that, the limitations "second conductive medium" and "second external circuit layer" are only used to distinguish the first conductive medium and the first external circuit layer. In an embodiment of the present invention, the first conductive medium and the second conductive medium may be made of same/different conductive materials, and the first external circuit layer and the second external circuit layer may include same/different circuit structures.

Figure 9:
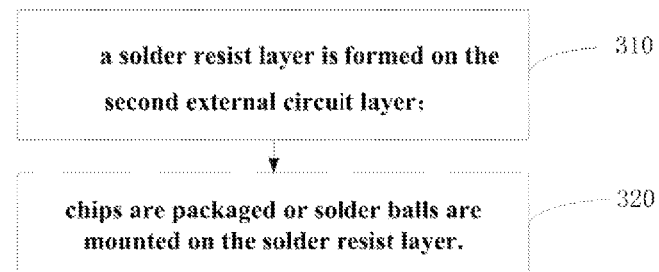
FIG. 9 illustrates the flow diagram of a chip embedded package method in another embodiment of the present invention.

FIG. 9 illustrates the flow diagram of a chip embedded package method in another embodiment of the present invention. As shown in FIG. 9, besides the steps shown in FIG. 1 and FIG. 7, the chip embedded package method further include following steps.

Figure 10:
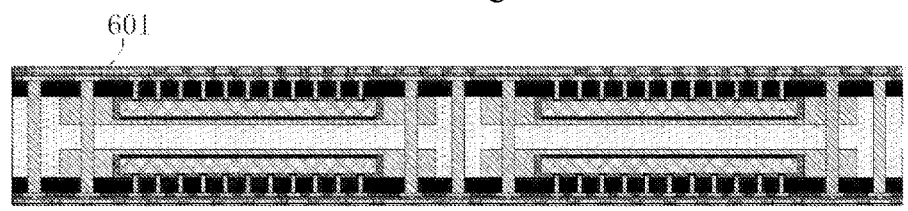
FIG. 10 illustrates a chip embedded package structure in an embodiment of the present invention.

Step 310: as shown in FIG. 10, a solder resist layer 601 is formed on the second external circuit layer. Specifically, the solder resist layer 601 may be made of ink or dry film solder resist material.

Figure 11:
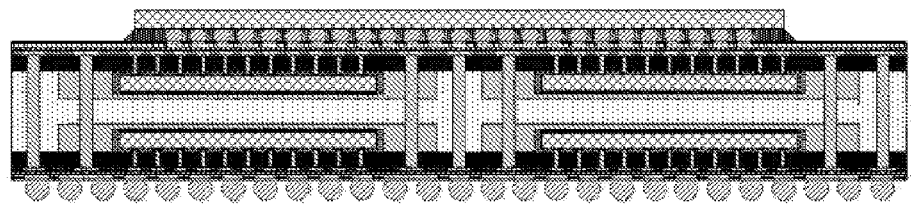
FIG. 11 illustrates a chip embedded package structure in another embodiment of the present invention.

Step 320: as shown in FIG. 11, chips are packaged or solder balls are mounted on the solder resist layer 601. I.e., the second package module obtained from the above steps is considered as a substrate for packaging chips or mounting solder balls.

Those skilled in the art can understand that, in an embodiment of the present invention, a solder resist layer 601 may be formed on a first external circuit layer directly, then chips are packaged or solder balls are mounted on the solder resist layer 601.

The package structure formed by steps in FIG. 1 includes a second package module 100, blind-holes 202, via-holes 301 and first external circuit layers, as shown in FIG. 6. The second package module 100 includes a combination of two primary package modules, which is obtained by sandwiching a prepreg or ABF between the two primary package modules. The primary package module (organic substrate) includes a core layer, sandwiched between two metal layers, one metal layer is thicker than the other one; metallic sinks 103 etched on the thicker metal layer; part of metallic sinks 103 are used for packaging at least one chip 102, and other metallic sinks 103 are used for via-holes 301; the at least one chip 102 is mounted into a metallic sink 103 via adhesive 102a. The blind-holes 202 are drilled on both sides of the second package module to pass through the adhesive 102a, and filled with conductive medium. The via-holes 301 are drilled to get through the second package module 100 and filled with conductive medium as well, wherein the via-holes 301 locate beyond the metallic sinks with chips. Both sides of the second package module are also plated with the first conductive medium 401. The first external circuit layers, constructed on both sides of the second package module 100, are used to further package chips or mounting solder balls Those skilled in the art can understand that the limitations "primary", "first" or "second" are only used to simplify the description, which cannot be used to limit the protection scope of the present invention.

Different from the package structure in the embodiment of FIG. 1, the package structure formed by steps in FIG. 7 further includes second external circuit layers 501, medium layers 500 and blind-holes drilled to pass through the medium layers 500. As shown in FIG. 8b, The second external circuit layers 501 are constructed on both sides of the second package module and used for packaging chips or mounting solder balls. The blind-holes are filled with conductive medium as well.

Different from the package structure in the embodiment of FIG. 7, the package structure formed by steps in FIG. 9 may further include a solder resist layer 601, which formed on the second external circuit layer 501, as shown in FIG. 10.

Those skilled in the art can understand that, the protection scope of the present invention should not be limited within the subject matter of the above embodiments. Therefore, the embodiment is exemplary and non-restrictive under whichever circumstances. The region of the present invention is restricted by the claims attached other than the illustrations above. Considering of which, all the adjustments in accordance with the principle and the scope of claims are considered to be within the protection scope of the present invention. Any signs in the drawings of the claims should not be considered as the restriction to the claims referred.

Moreover, it should be understood that although this literature is described in embodiments, however, not each embodiment has merely one independent technical scheme. This way of description is used barely for clarity. For those skilled in the art, this literature should be considered as an entirety. Technical schemes from each embodiment could be properly combined and form as other embodiments that can be understood by those skilled in the art.

The invention claimed is:

1. A chip embedded package structure, comprising:
   a combination of two organic substrates, wherein, one organic substrate is flipped on the other and each organic substrate comprises:
      a corelayer;
      a metal layer on the corelayer;
      metallic sinks etched on the metal layer; part of metallic sinks used for packaging at least one chip, and other metallic sinks used for via-holes;
      the at least one chip mounted into a metallic sink via adhesive;
   blind-holes on both sides of the combination of the two organic substrates and passing through the adhesive;
   via-holes, getting through the combination of the two organic substrates, and
   wherein the via-holes are located beyond the metallic sinks with chips, and at least one of the via-holes is connected with the metal layer; and
   wherein, the blind-holes and via-holes are filled with conductive medium.

2. The structure of claim 1, wherein, the combination of the two organic substrates further comprises:
   a prepreg or ABF sandwiched between the two organic substrates.

3. The structure of claim 1, further comprising:
   an external circuit layer, constructed on both sides of the combination.

4. The structure of claim 3, further comprising:
   a medium layer, above the external circuit layer;
   a second external circuit layer, constructed on the medium layer.

5. The structure of claim 4, wherein, the medium layer is made of prepreg or ABF material.

6. The structure of claim 4, wherein, the second external circuit layer comprises:
   blind-holes, passing through the medium layer and filled with conductive medium.

7. The structure of claim 3, further comprising:
   a solder resist layer, formed on the external circuit layer.

* * * * *